United States Patent
Endo et al.

(10) Patent No.: US 11,674,053 B2
(45) Date of Patent: *Jun. 13, 2023

(54) COMPOSITION FOR FORMING UNDERLAYER FILM OF SELF-ASSEMBLED FILM INCLUDING ALIPHATIC POLYCYCLIC STRUCTURE

(71) Applicant: NISSAN CHEMICAL INDUSTRIES, LTD., Tokyo (JP)

(72) Inventors: Takafumi Endo, Toyama (JP);
Yasunobu Someya, Toyama (JP);
Hiroyuki Wakayama, Toyama (JP);
Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/917,853

(22) PCT Filed: Sep. 16, 2014

(86) PCT No.: PCT/JP2014/074411
§ 371 (c)(1),
(2) Date: Mar. 9, 2016

(87) PCT Pub. No.: WO2015/041208
PCT Pub. Date: Mar. 26, 2015

(65) Prior Publication Data
US 2016/0222248 A1    Aug. 4, 2016

(30) Foreign Application Priority Data
Sep. 19, 2013 (JP) .............................. JP2013-194411

(51) Int. Cl.
*C09D 165/00* (2006.01)
*C09D 5/00* (2006.01)
(Continued)

(52) U.S. Cl.
CPC ............. *C09D 165/00* (2013.01); *B05D 1/38* (2013.01); *B05D 3/0254* (2013.01);
(Continued)

(58) Field of Classification Search
None
See application file for complete search history.

(56) References Cited

U.S. PATENT DOCUMENTS

| 3,808,018 | A | 4/1974 | Plueddemann |
| 7,427,464 | B2* | 9/2008 | Hatakeyama ........... G03F 7/091 |
| | | | 430/270.1 |

(Continued)

FOREIGN PATENT DOCUMENTS

| JP | S48-80635 A | 10/1973 |
| JP | 2003-165944 A | 6/2003 |

(Continued)

OTHER PUBLICATIONS

English-language translation of the Written Opinion of the International Searching Authority for PCT/JP2014/074411, dated Dec. 22, 2014, 7 pages. (Year: 2014).*

(Continued)

*Primary Examiner* — Satya B Sastri
(74) *Attorney, Agent, or Firm* — Oliff PLC

(57) ABSTRACT

A composition for forming an underlayer film necessary for facilitating alignment of self-assembled film into desired vertical pattern. Composition for forming an underlayer film of self-assembled film including a polymer having unit structure containing aliphatic polycyclic structure of aliphatic polycyclic compound in main chain. The polymer is a polymer having unit structure containing aliphatic polycyclic structure of aliphatic polycyclic compound with aromatic ring structure of aromatic ring-containing compound or polymer chain derived from vinyl group of vinyl group-containing compound in main chain. The polymer has unit structure of Formula (1):

$$\text{--}(\text{X}\text{--}\text{Y})\text{--}$$    Formula (1)

(Continued)

wherein X is single bond, divalent group having vinyl structure as polymer chain, or divalent group having aromatic ring-containing structure as polymer chain, and Y is divalent group having aliphatic polycyclic structure as polymer chain. The aliphatic polycyclic compound is bi- to hexa-cyclic diene compound. The aliphatic polycyclic compound is dicyclopentadiene or norbornadiene.

14 Claims, 1 Drawing Sheet

(51) Int. Cl.
| | |
|---|---|
| *C09D 201/02* | (2006.01) |
| *C08L 101/02* | (2006.01) |
| *C09J 133/06* | (2006.01) |
| *G03F 7/00* | (2006.01) |
| *C09D 145/00* | (2006.01) |
| *G03F 7/11* | (2006.01) |
| *G03F 7/09* | (2006.01) |
| *B05D 1/38* | (2006.01) |
| *B05D 3/02* | (2006.01) |
| *B05D 1/18* | (2006.01) |
| *B05D 7/00* | (2006.01) |
| *C09D 201/00* | (2006.01) |
| *C08G 83/00* | (2006.01) |

(52) U.S. Cl.
CPC .............. *C08L 101/02* (2013.01); *C09D 5/00* (2013.01); *C09D 145/00* (2013.01); *C09D 201/00* (2013.01); *C09D 201/02* (2013.01); *C09J 133/066* (2013.01); *G03F 7/0002* (2013.01); *G03F 7/091* (2013.01); *G03F 7/11* (2013.01); *B05D 1/185* (2013.01); *B05D 7/52* (2013.01); *C08G 83/008* (2013.01); *C08G 2261/148* (2013.01); *C08G 2261/1422* (2013.01); *C08G 2261/1426* (2013.01); *C08G 2261/312* (2013.01); *C08G 2261/3142* (2013.01); *C08G 2261/3162* (2013.01); *C08G 2261/3241* (2013.01); *C08G 2261/3246* (2013.01); *C08G 2261/3325* (2013.01)

(56) References Cited

U.S. PATENT DOCUMENTS

| | | | | |
|---|---|---|---|---|
| 7,476,485 B2 * | 1/2009 | Hatakeyama | ........... | G03F 7/038 430/311 |
| 8,017,296 B2 * | 9/2011 | Houlihan | ............. | C09D 165/00 422/40 |
| 9,343,324 B2 * | 5/2016 | Shinjo | ........................ | G03F 7/11 |
| 2006/0234158 A1 * | 10/2006 | Hatakeyama | ........... | G03F 7/094 430/313 |
| 2008/0020667 A1 | 1/2008 | Hsu et al. | | |
| 2008/0206676 A1 * | 8/2008 | De | .......................... | G03F 7/091 430/281.1 |

FOREIGN PATENT DOCUMENTS

| | | | | | |
|---|---|---|---|---|---|
| JP | 2004354554 A | * | 12/2004 | ............. | G03F 7/038 |
| JP | 2006-321824 A | | 11/2006 | | |
| JP | 2007-284623 A | | 11/2007 | | |
| JP | 2009-092691 A | | 4/2009 | | |
| JP | 2009-093162 A | | 4/2009 | | |
| JP | 2009-234114 A | | 10/2009 | | |
| JP | 2010-519594 A | | 6/2010 | | |
| JP | 2010-520930 A | | 6/2010 | | |
| JP | 2011-122081 A | | 6/2011 | | |
| JP | 2012-063653 A | | 3/2012 | | |
| JP | 2012063653 A | * | 3/2012 | | |
| JP | 2012-078828 A | | 4/2012 | | |
| JP | WO 2013005797 A1 | * | 1/2013 | ................ | G03F 7/11 |
| JP | 2013-189571 A | | 9/2013 | | |
| JP | 2013-212569 A | | 10/2013 | | |
| JP | 2013-216859 A | | 10/2013 | | |
| WO | 2008/015969 A1 | | 2/2008 | | |
| WO | 2012/036121 A1 | | 3/2012 | | |
| WO | 2013/005797 A1 | | 1/2013 | | |
| WO | 2013/073505 A1 | | 5/2013 | | |
| WO | 2014/097993 A1 | | 6/2014 | | |
| WO | 2014/098025 A1 | | 6/2014 | | |

OTHER PUBLICATIONS

JP 2012063653 A, Mar. 2012, Machine Translation.*
JP-2004354554-A, Dec. 2004, Machine translation (Year: 2004).*
Dec. 22, 2014 Search Report issued in International Patent Application No. PCT/JP2014/074411.
Dec. 22, 2014 Written Opinion issued in International Application No. PCT/JP2014/074411.

* cited by examiner

COMPOSITION FOR FORMING UNDERLAYER FILM OF SELF-ASSEMBLED FILM INCLUDING ALIPHATIC POLYCYCLIC STRUCTURE

TECHNICAL FIELD

The present invention relates to a composition for forming an underlayer film of a thermosetting self-assembled film to be formed by thermal baking. The composition is used for a liquid crystal display, a recording material for a hard disk, a solid-state imaging element, a solar cell panel, a light-emitting diode, an organic light-emitting device, a luminescent film, a fluorescent film, MEMS, an actuator, an anti-reflective material, a resist, a resist underlayer film, a resist upper layer film, or a template (mold) for nanoimprint. The present invention also relates to a method for forming the thermosetting self-assembled film and a self-assembled film using the underlayer film, and a method for forming a processing pattern.

BACKGROUND ART

A thermosetting self-assembled film having a nano-scale repeating structure is known to have characteristics different from a typical film having the same quality. A self-assembled film having a nano-scale repeating structure using a block copolymer has been proposed.

Characteristics of an organic photochromic material that is mixed in a non-curable polystyrene-poly(methyl methacrylate) copolymer have been reported.

Characteristics of nanopatterning by plasma etching using a non-curable polystyrene-poly(methyl methacrylate) copolymer have been reported.

A coating composition for a thin film using a block polymer composed of a polymer chain having a fluorine-containing vinyl monomer unit and a polymer chain having a vinyl monomer unit having at least silyl group is disclosed (see Patent Document 1).

A method for forming a pattern on a block polymer layer by regularly aligning a plurality of segments constituting a block polymer is disclosed (see Patent Document 2).

Furthermore, a film-forming composition containing a block copolymer, a cross-linker, and an organic solvent is disclosed. In a self-assembled film using the film-forming composition, pattern information can be input in an underlayer film (e.g., organic film) to pattern the block polymer into a cylinder form. In order to align a pattern at a target position, a polymer chain (A) component and a polymer chain (B) component of a (self-assembled) film-forming composition using a block polymer can be aligned at each target position on the underlayer film (e.g., organic film) by irradiating the underlayer film on a processed substrate with ultraviolet light or radiation at a position corresponding to the alignment position and changing the irregularities and (hydrophilic or hydrophobic) surface energy of surface of the underlayer film (see Patent Document 3)

PRIOR ART DOCUMENTS

Patent Documents

Patent Document 1: Japanese Patent Application Publication No. 2007-284623 (JP 2007-284623 A)

Patent Document 2: Japanese Patent Application Publication No. 2009-234114 (JP 2009-234114 A) Patent Document 3: Japanese Patent Application Publication No. 2011-122081 (JP 2011-122081 A)

SUMMARY OF THE INVENTION

Problem to be Solved by the Invention

It is an object of the present invention to provide a composition for forming an underlayer film necessary for facilitating the alignment of a self-assembled film into a desired vertical pattern during formation of the self-assembled film using a block polymer or the like. In particular, it is an object of the present invention to provide a composition for forming an underlayer film of a self-assembled film that allows a vertical pattern to be formed in the self-assembled film without causing intermixing (mixing of layers) with the self-assembled film as an upper layer.

Means for Solving the Problems

The present invention is, as a first aspect, a composition for forming an underlayer film of a self-assembled film comprising a polymer having a unit structure containing an aliphatic polycyclic structure of an aliphatic polycyclic compound in a main chain, as a second aspect, the composition for forming an underlayer film according to the first aspect, in which the polymer is a polymer having a unit structure containing an aliphatic polycyclic structure of an aliphatic polycyclic compound and an aromatic ring structure of an aromatic ring-containing compound in a main chain, as a third aspect, the composition for forming an underlayer film according to the first aspect, in which the polymer is a polymer having a unit structure containing an aliphatic polycyclic structure of an aliphatic polycyclic compound and a polymer chain derived from a vinyl group of a vinyl group-containing compound in a main chain, as a fourth aspect, the composition for forming an underlayer film according to any one of the first to third aspects, in which the polymer has a unit structure of Formula C(1):

 Formula (1)

(in Formula (1), X is a single bond, a divalent group having a vinyl structure derived from a vinyl group-containing compound as a polymer chain, or a divalent group having an aromatic ring-containing structure derived from an aromatic ring-containing compound as a polymer chain, and Y is a divalent group having an aliphatic polycyclic structure derived from an aliphatic polycyclic compound as a polymer chain), as a fifth aspect, the composition for forming an underlayer film according to any one of the first to fourth aspects, in which the aliphatic polycyclic compound is a bi- to hexa-cyclic diene compound, as a sixth aspect, the composition for forming an underlayer film according to any one of the first to fifth aspects, in which the aliphatic polycyclic compound is dicyclopentadiene or norbornadiene, as a seventh aspect, the composition for forming an underlayer film according to any one of the third to sixth aspects, in which the vinyl group-containing compound is alkene, acrylate, or methacrylate, as an eighth aspect, the composition for forming an underlayer film according to any one of the second to eighth aspects, in which the aromatic ring-containing compound is a homocyclic compound or a heterocyclic compound, as a ninth aspect, the composition for forming an underlayer film according to the eighth aspect, in which the homocyclic compound is benzene optionally substituted or naphthalene optionally substituted, as a tenth aspect, the composition for forming an underlayer film according to the eighth aspect, in which the heterocyclic compound is carbazole optionally substituted or phenothiazine optionally substituted, as an eleventh aspect, the composition for forming an underlayer film according to any one of the first to tenth aspects, further comprising a cross-linker, as a twelfth aspect, the composition for forming an underlayer film according to any one of the first to eleventh aspects, further comprising an acid or an acid generator, as a thirteenth aspect, a method for forming a pattern structure comprising steps of: applying the composition for forming an underlayer film of a self-assembled film according to any one of the first to twelfth aspects on a substrate, followed by baking, to form an underlayer film; and applying a composition for forming a self-assembled film on the underlayer film, followed by baking, to form a self-assembled film, as a fourteenth aspect, the method for forming a pattern structure according to the thirteenth aspect, comprising a step of forming an underlying film prior to the step of applying the composition for forming an underlayer film of a self-assembled film, followed by baking, to form an underlayer film, as a fifteenth aspect, the method for forming a pattern structure according to the fourteenth aspect, in which the underlying film is an anti-reflective coating or a hard mask, and as a sixteenth aspect, a device having a pattern structure formed by the method for forming a pattern structure according to any one of the thirteenth to fifteenth aspects.

Effects of the Invention

A thermosetting self-assembled film obtained by thermal baking and used in the present invention is a block polymer containing an organic polymer chain (A) having an organic monomer (a) as a unit structure and a polymer chain (B) that forms a bond with the organic polymer chain (A) and contains a monomer (b) different from the organic monomer (a) as a unit structure.

In such a block polymer, microphase separation is induced to cause self-assembly. An underlayer film formed from the composition for forming an underlayer film of the present invention can be used as an underlayer film of the film.

Specifically, the underlayer film formed from the composition of the present invention is a novolac resin having an aliphatic polycyclic structure, and allows microphase separation of a self-assembling polymer present at an upper layer. Thus, a self-assembled film having a vertical lamellar structure or a vertical cylinder structure can be formed.

In addition, the underlayer film formed from the composition of the present invention does not cause intermixing (mixing of layers) with the self-assembled film of the upper layer and allows a vertical pattern to be formed in the self-assembled film.

Such a self-assembled film formed by microphase separation is considered to be used for various applications using a difference in properties between the polymer having the polymer chain (A) and the polymer having the polymer chain (B). For example, when a difference in etching rate (alkali dissolution rate or gas etching rate) between the polymers is used, a pattern corresponding to a resist pattern can be formed.

MODES FOR CARRYING OUT THE INVENTION

Figure 1:
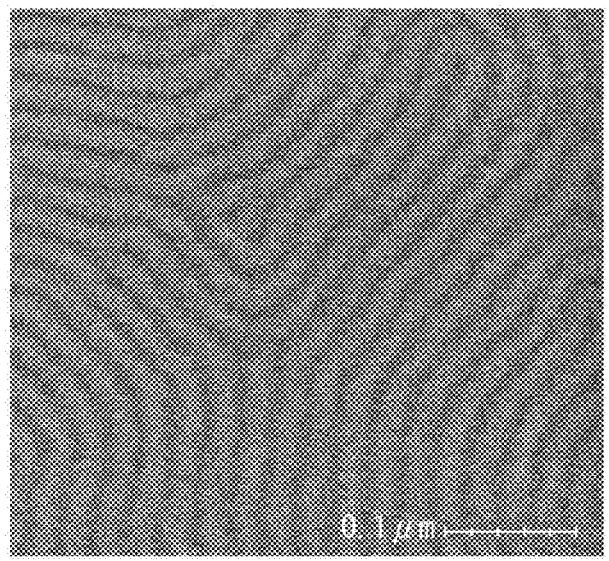
FIG. 1 is an electron micrograph of a self-assembled film of block copolymer that is formed on an underlayer film formed from a composition for forming an underlayer film of a self-assembled film obtained in Example 1 and that forms a vertical lamella structure (magnification: 200,000 times).

The present invention is a composition for forming an underlayer film of a self-assembled film comprising a polymer having a unit structure containing an aliphatic polycyclic structure of an aliphatic polycyclic compound in a main chain.

The composition for forming an underlayer film of a self-assembled film may contain the polymer and a solvent, and further contain an acid or an acid generator. The composition for forming an underlayer film may contain a surfactant, if desired.

The composition for forming an underlayer film of a self-assembled film is a component for forming a film present at a lower layer of a self-assembled film. The composition for forming an underlayer film is applied on a substrate, and baked to form an underlayer film. A composition for forming a self-assembled film is applied on the underlayer film, and dried to form a self-assembled film.

The solid content of the composition for forming an underlayer film may be 0.01 to 20% by mass, 0.01 to 15% by mass, or 0.1 to 15% by mass. Herein, the solid content is a ratio of the composition for forming an underlayer film except for the solvent and water.

The ratio of the polymer in the solid content may be 60 to 100% by mass, 70 to 99% by mass, or 70 to 99% by mass.

The polymer may be a polymer having a unit structure containing an aliphatic polycyclic structure of an aliphatic polycyclic compound and an aromatic ring structure of an aromatic ring-containing compound in a main chain of a polymer chain.

The polymer may be a polymer having a unit structure containing an aliphatic polycyclic structure of an aliphatic polycyclic compound and a polymer chain derived from a vinyl group of a vinyl group-containing compound in a main chain.

Examples of the vinyl group-containing compound include alkenes such as ethylene and propylene, and acrylates and methacrylates such as methyl acrylate and methyl methacrylate.

As the polymer, a structure of Formula (1) can be selected. In Formula (1), X is a single bond, a divalent group having a vinyl structure derived from a vinyl group-containing compound as a polymer chain, or a divalent group having an aromatic ring-containing structure derived from an aromatic ring-containing compound as a polymer chain, and Y is a divalent group having an aliphatic polycyclic structure derived from an aliphatic polycyclic compound as a polymer chain.

In Formula (1), when X is a divalent group having an aromatic ring-containing structure derived from an aromatic ring-containing compound as a polymer chain and Y is a divalent group having an aliphatic polycyclic structure derived from an aliphatic polycyclic compound as a polymer chain, the polymer represents a novolac resin.

It is preferable that the group Y in Formula (1) be a divalent group having an aliphatic polycyclic structure derived from an aliphatic polycyclic compound as a polymer chain, and the aliphatic polycyclic compound have at least two double bonds in the ring and typically be a bi- to hexa-cyclic diene compound. Examples of the diene compound include a bicyclo compound, a tricyclo compound, a tetracyclo compound, a pentacyclo compound, and a hexacyclo compound.

Examples of the aliphatic polycyclic compound include 2,5-norbornadiene, 3a,4,7,7a-tetrahydroindene, 1,3a,4,6a-tetrahydropentalene, and dicyclopentadiene. 2,5-Norbornadiene and dicyclopentadiene are preferred.

The aliphatic polycyclic compound may have any substituent. Examples of the substituent include alkyl group, phenyl group, a hydroxy group, a carboxyl group, a cyano group, a nitro group, and a halogen group (e.g., a fluorine group, a chlorine group, a bromine group, and an iodine group).

When the group X in Formula (1) is a divalent group having an aromatic ring-containing structure derived from an aromatic ring-containing compound as a polymer chain, examples of the aromatic ring-containing compound include a homocyclic compound and a heterocyclic compound. Examples of the homocyclic compound include benzene optionally substituted and naphthalene optionally substituted. Examples of the heterocyclic compound include carbazole optionally substituted and phenothiazine optionally substituted.

Examples of the aromatic ring-containing compound include compounds having a hydroxy group and an amino group as an electron-donating organic group.

Examples of the aromatic ring-containing compound include phenol, cresol, 4-phenylphenol, 1-naphthol, catechol, resorcinol, hydroquinone, 4,4'-biphenol, 2,2'-biphenol, 2,2-bis(hydroxyphenyl)propane, 1,5-dihydroxynaphthalene, pyrogallol, phloroglucinol, aniline, carbazole, phenyl-1-naphthylamine, triphenylamine, 2-phenylindole, and phenothiazine. Phenol, carbazole, and phenothiazine are preferred.

The novolac resin in which in Formula (1), X is a divalent group having an aromatic ring-containing structure derived from an aromatic ring-containing compound as a polymer chain and Y is a divalent group having an aliphatic polycyclic structure derived from an aliphatic polycyclic compound as a polymer chain is a novolac resin obtained by a condensation reaction of an aromatic ring-containing compound with an aliphatic polycyclic compound. In the condensation reaction, an aliphatic polycyclic compound having a diene structure can be used in an amount of 0.1 to 10 equivalent weights relative to 1 equivalent weight of phenyl group that is contained in the aromatic ring-containing compound and involved in the reaction.

As an acid catalyst used in the condensation reaction, for example, a mineral acid such as sulfuric acid, phosphoric acid, and perchloric acid, an organic sulfonic acid such as methanesulfonic acid, trifluoromethanesulfonic acid, p-toluenesulfonic acid, and p-toluenesulfonic acid monohydrate, or a carboxylic acid such as formic acid and oxalic acid is used. The amount of acid catalyst to be used is variously selected depending on the kind of acid to be used. The amount is usually 0.001 to 10,000 parts by mass, preferably 0.01 to 1,000 parts by mass, and more preferably 0.1 to 100 parts by mass, relative to 100 parts by mass of the aromatic ring-containing compound and the aliphatic polycyclic compound having a diene in total.

The condensation reaction can be carried out without a solvent, but the condensation reaction is usually carried out using the solvent. Any solvent can be used as long as it does not inhibit the reaction. Examples thereof include toluene, 1,4-dioxane, propylene glycol monomethyl ether, propylene glycol monomethyl ether acetate, and butyl cellosolve. When the acid catalyst to be used is, for example, liquid like formic acid, it can also serves as a solvent.

The reaction temperature during condensation is usually 40° C. to 200° C. The reaction time is variously selected depending on the reaction temperature, and is usually about 30 minutes to about 50 hours.

The weight average molecular weight Mw of the novolac resin obtained as described above is usually 500 to 1,000,000 or 600 to 200,000.

Examples of the novolac resin may be as follows.

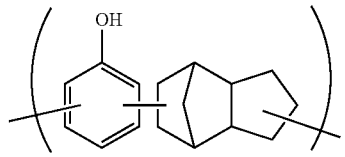

Formula (1-1)

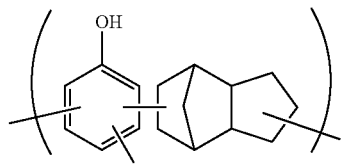

Formula (1-2)

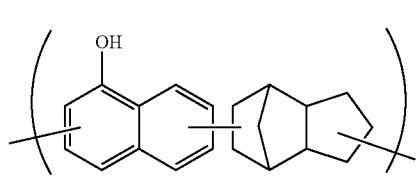

Formula (1-3)

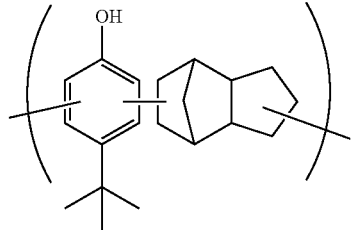

Formula (1-4)

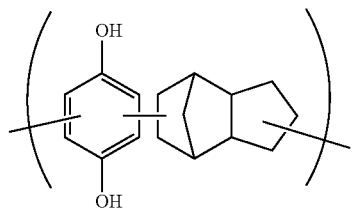

Formula (1-5)

Formula (1-6)
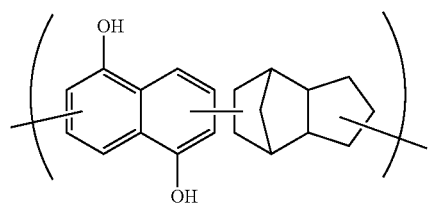
Formula (1-7)
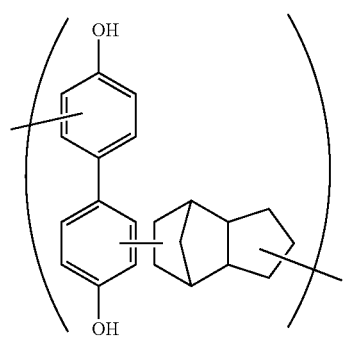
Formula (1-8)
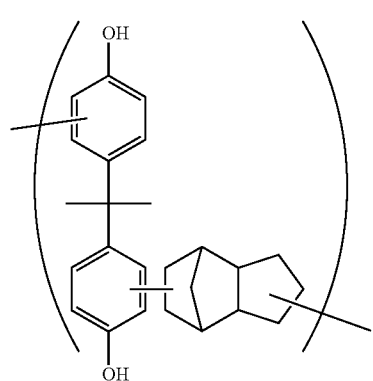
Formula (1-9)
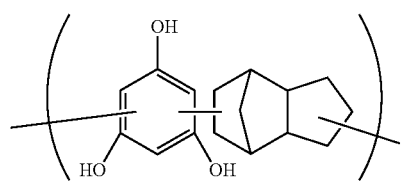
Formula (1-10)
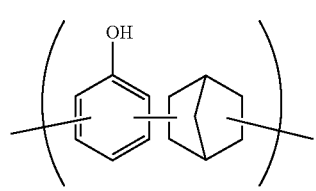
Formula (1-11)
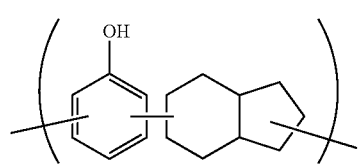
Formula (1-12)
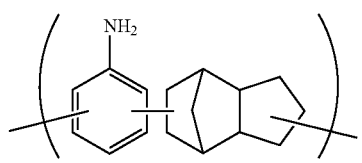
Formula (1-13)
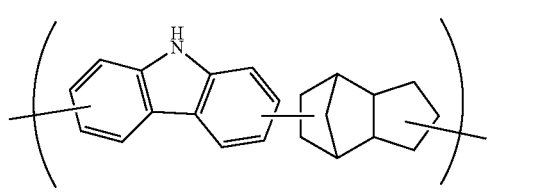
Formula (1-14)
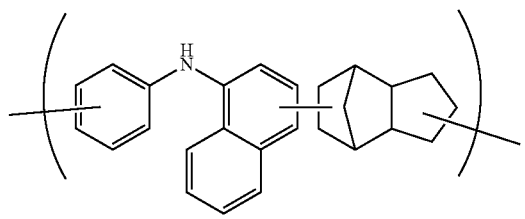
Formula (1-15)
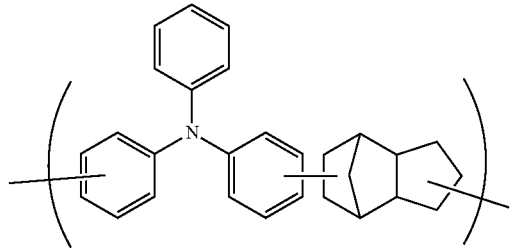
Formula (1-16)
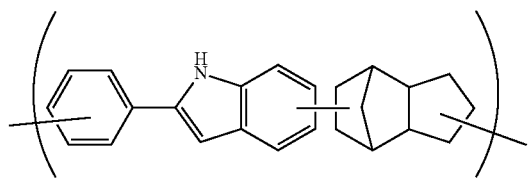
Formula (1-17)
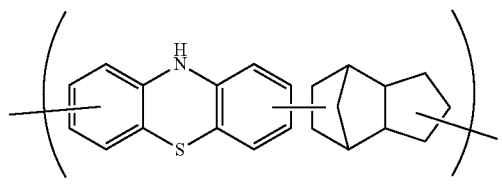
Formula (1-18)
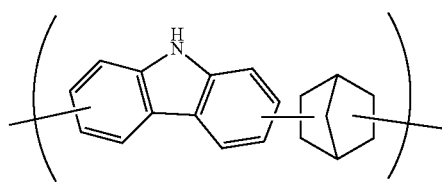

-continued

Formula (1-19)

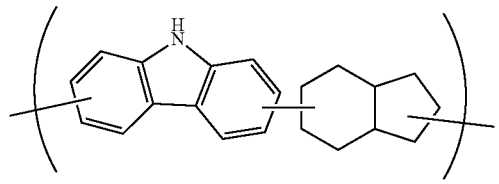

The novolac resin may have an epoxy group.

Examples of the novolac resin having an epoxy group include an epoxyphenol-dicyclopentadiene resin, an epoxycresol-dicyclopentadiene resin, an epoxyphenol-norbornadiene resin, an epoxynaphthol-dicyclopentadiene resin, and an epoxydihydoxynaphthalene-dicyclopentadiene resin. In particular, the epoxyphenol-dicyclopentadiene resin is known as an article on the market (dicyclopentadiene-type epoxy resin, trade name: EPICLON HP-7200H, available from DIC Corporation).

Examples of the novolac resin having an epoxy group may be as follows.

Formula (2-1)

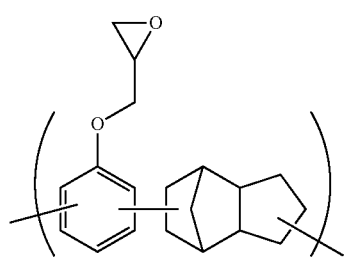

Formula (2-2)

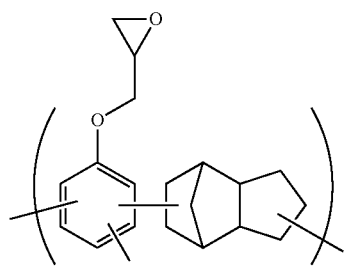

Formula (2-3)

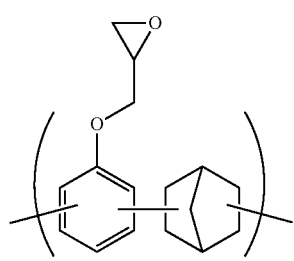

Formula (2-4)

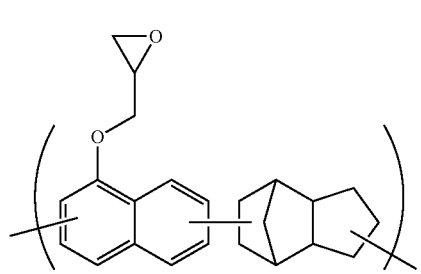

Formula (2-5)

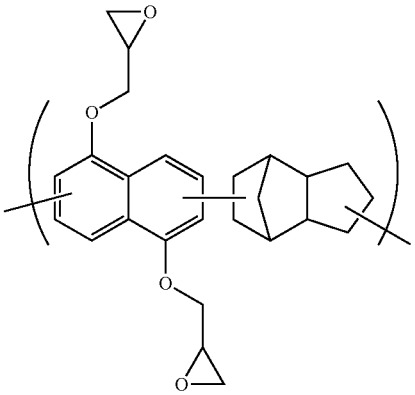

To the novolac resin having an epoxy group, an organic compound Z to be reacted with the epoxy group can be added. Examples of the organic compound Z include carboxylic acid, phenol, amine, and imide compounds.

Examples of the organic compound Z include benzoic acid, 4-toluic acid, 4-tert-butylbenzoic acid, 4-phenylbenzoic acid, salicylic acid, 4-hydroxybenzoic acid, 4-methoxycarboxylic acid, 4-tert-butoxybenzoic acid, 4-fluorobenzoic acid, 4-chlorobenzoic acid, 1-naphthoic acid, 9-anthracenecarboxylic acid, n-butanoic acid, n-hexanoic acid, n-octanoic acid, pivalic acid, cyclohexanecarboxylic acid, 1-methylcyclohexanecarboxylic acid, adamantanecarboxylic acid, cinnamic acid, succinic anhydride, phthalic anhydride, phenol, cresol, anisole, 4-tert-butylphenol, 4-phenylphenol, 1-naphthol, N-butylamine, N-dibutylamine, piperidine, aniline, succinimide, maleimide, phthalimide, and diallylisocyanuric acid. 4-Tert-butylbenzoic acid, 4-phenylbenzoic acid, 1-naphthoic acid, 9-anthracenecarboxylic acid, n-butanoic acid, n-hexanoic acid, n-octanoic acid, pivalic acid, cyclohexanecarboxylic acid, 1-methylcyclohexanecarboxylic acid, cinnamic acid, 1-naphthol, and 4-phenylphenol are particularly preferred.

A novolac resin used in the present invention is obtained by a reaction of the novolac resin having an epoxy group with the organic compound Z capable of being added to the epoxy group. In the addition reaction, the organic compound Z can be used in an amount of 0.1 to 1 equivalent weights relative to 1 equivalent weight of the epoxy group in the novolac resin. Two or more organic compounds Z may be used in combination.

A catalyst of activating the epoxy group used in the addition reaction is, for example, a quaternary phosphonium salt such as ethyltriphenylphosphonium bromide or a quaternary ammonium salt such as benzyltributylammonium chloride. The amount of the catalyst is usually 0.001 to 1 equivalent weights relative to 1 equivalent weight of the epoxy group in the novolac resin.

The addition reaction can be carried out without a solvent, but the addition reaction is usually carried out using the solvent. Any solvent can be used as long as it does not inhibit the reaction. For example, an alcohol such as propylene glycol monomethyl ether, an ester such as propylene glycol monomethyl ether acetate and ethyl lactate, or a ketone such as cyclohexanone is suitably used since they have high solubility in the novolac resin.

The reaction temperature during the addition reaction is usually 40° C. to 200° C. The reaction time is variously selected depending on the reaction temperature, and is usually about 30 minutes to about 50 hours.
The weight average molecular weight Mw of the novolac resin obtained as described above is usually 500 to 1,000,000 or 600 to 200,000.
Examples of the novolac resin may be as follows.
Formula (3-1)
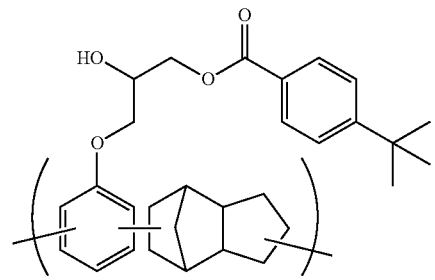
Formula (3-2)
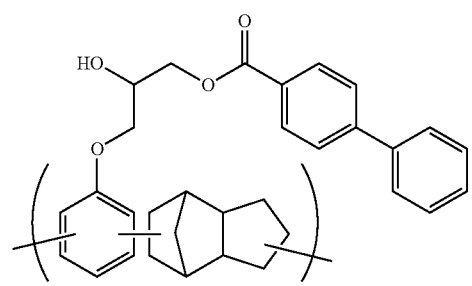
Formula (3-3)
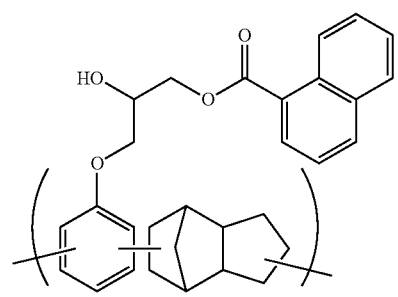
Formula (3-4)
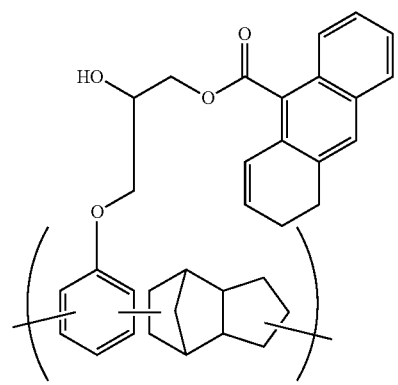
Formula (3-5)
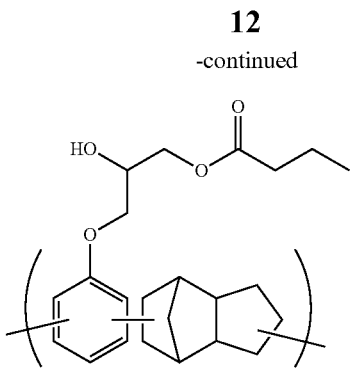
Formula (3-6)
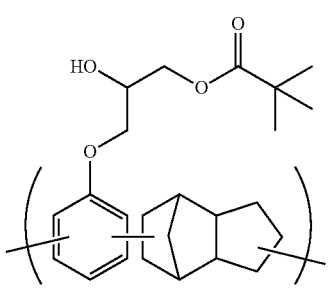
Formula (3-7)
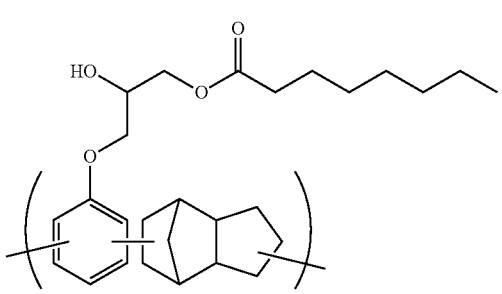
Formula (3-8)
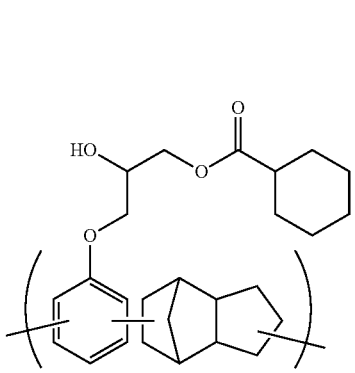
Formula (3-9)
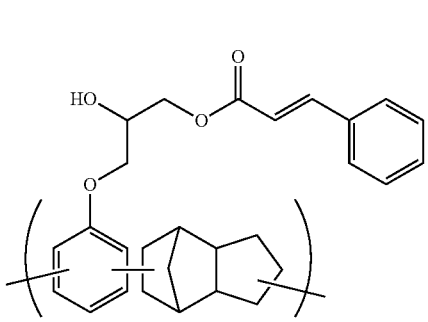

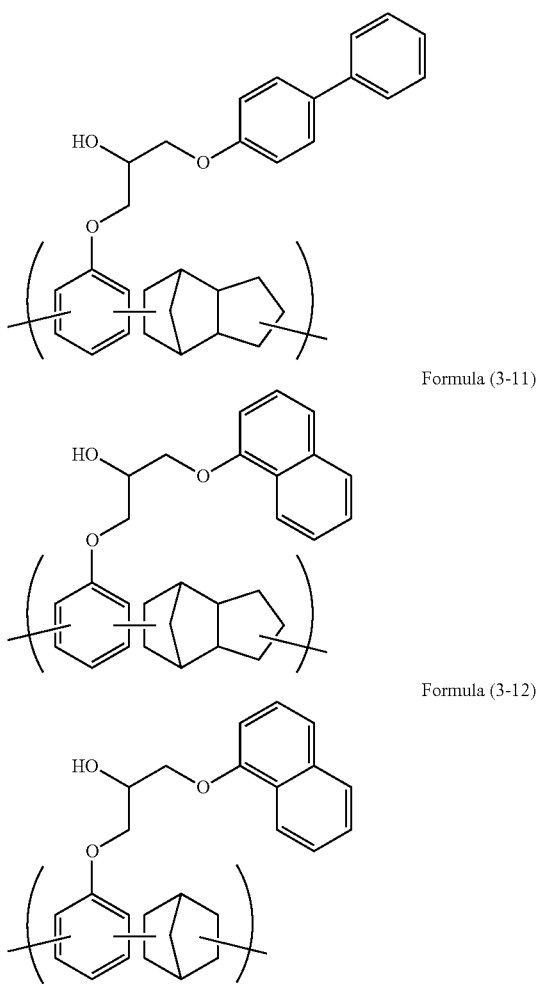

Formula (3-10)

Formula (3-11)

Formula (3-12)

The composition for forming an underlayer film of a self-assembled film of the present invention may contain one or more polymers other than the polymer having a unit structure containing an aliphatic polycyclic structure of an aliphatic polycyclic compound in a main chain (typically the novolac resin). In particular, when the novolac resin of the present invention is added to a composition for forming an underlayer film that cannot form a vertical pattern in a self-assembled film, a vertical pattern can be formed in a self-assembled film.

The amount of novolac resin to be added varies depending on a coating solvent to be used, a baking condition of the composition for forming an underlayer film of a self-assembled film, a baking condition of the self-assembled film, and an underlying substrate to be used. The polymer having a unit structure containing an aliphatic polycyclic structure of an aliphatic polycyclic compound in a main chain (typically the novolac resin) may be contained in an amount of 0.1 to 100% by mass, preferably 5 to 100% by mass, and further preferably 10 to 100% by mass in all polymers including the other polymers.

The composition for forming an underlayer film of a self-assembled film of the present invention may contain a cross-linker component. Examples of the cross-linker include a melamine-based compound, a substituted urea-based compound, and polymers thereof. A cross-linker having at least two cross-link-forming substituents is preferred. Examples thereof include methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and a compound of methoxymethylated thiourea. A condensate thereof may be also used.

The amount of cross-linker to be added varies depending on a coating solvent to be used, a underlying substrate to be used, a solution viscosity to be required, and a film form to be required. The amount is 0.001 to 80% by mass, preferably 0.01 to 50% by mass, and further preferably 0.05 to 40% by mass, relative to the total solid content. The cross-linker may cause a cross-linking reaction due to self-condensation. However, when the polymer of the present invention has a cross-linkable substituent, the cross-linker may cause a cross-linking reaction with the cross-linkable substituent.

In the present invention, as a catalyst for promoting the cross-linking reaction, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and another organic alkyl sulfonate may be mixed. The amount of catalyst to be mixed is 0.0001 to 20% by mass, preferably 0.0005 to 10% by mass, and further preferably 0.01 to 3% by mass, relative to the total solid content.

Therefore, the composition for forming an underlayer film of a self-assembled film of the present invention may contain an acid generator.

Examples of the acid generator include a photoacid generator in addition to the thermal acid generator.

The photoacid generator generates an acid during exposure of a resist. For this reason, the acidity of the underlayer film can be adjusted. This is one of methods of adjusting the acidity of the underlayer film to the acidity of resist of an upper layer. Adjusting the acidity of the underlayer film allows adjusting a resist pattern profile formed in the upper layer.

Examples of the photoacid generator in the composition for forming an underlayer film of the present invention include an onium salt compound, a sulfonimide compound, and a disulfonyldiazomethane compound.

Examples of the onium salt compound include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate, and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-n-butanesulfonyloxy)succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

One photoacid generator may be used alone, or two or more thereof may be used in combination.

When the photoacid generator is used, the amount thereof is 0.01 to 5 parts by mass, 0.1 to 3 parts by mass, or 0.5 to 1 parts by mass, relative to 100 parts by mass of polymer.

In addition, the composition for forming an underlayer film of the present invention may further contain a rheology-controlling agent, an adhesive adjuvant, a surfactant, or the like, if necessary.

The rheology-controlling agent is added to mainly improve fluidity of the composition for forming an underlayer film, and in particular, to improve the film thickness uniformity of the composition for forming an underlayer film at a baking step. Specific examples thereof include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate.

The rheology-controlling agent is usually mixed in an amount of less than 30% by mass relative to the total solid content of the composition for forming an underlayer film.

In the composition for forming an underlayer film of the present invention, the surfactant can be mixed to further improve the coating properties against unevenness of a surface without generation of pinholes and striation.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including Eftop EF301, EF303, and EF352 (trade name, available from Tohkem Products Corporation), MEGAFACE F171, F173, and R-30 (trade name, available from DIC Corporation), Fluorad FC-430 and FC431 (trade name, available from Sumitomo 3M, Ltd.), Asahi Guard AG710, and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of the surfactant to be mixed is usually 2.0% by mass or less, and preferably 1.0% by mass or less, relative to the total solid content of the composition for forming an underlayer film of the present invention. The surfactant may be added alone or two or more thereof may be added in combination.

In the present invention, as a solvent capable of dissolving the polymer, the cross-linker component, the cross-linking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used. The organic solvent can be used alone, or two or more thereof can be used in combination.

Furthermore, the solvent can be used in a mixture with a solvent having a high boiling point such as propylene glycol monobutyl ether and propylene glycol monobutyl ether acetate. Among the solvents, propylene glycol monomethyl ether, propylene glycol monomethyl ether acetate, ethyl lactate, butyl lactate, and cyclohexanone are preferred in terms of improved leveling properties.

Hereinafter, the use of the composition for forming an underlayer film of a self-assembled film of the present invention will be described.

A pattern structure for forming a self-assembled film is formed by steps of applying the composition for forming an underlayer film of a self-assembled film of the present invention on a substrate, followed by baking, to form an underlayer film, and applying a composition for forming a self-assembled film on the underlayer film, followed by baking.

Examples of the substrate include a silicon wafer substrate, a silicon-silicon dioxide-coated substrate, a silicon nitride substrate, a glass substrate, an ITO substrate, a polyimide substrate, and a low-dielectric constant material (low-k material)-coated substrate.

The composition for forming an underlayer film of the present invention is applied to the substrate by an appropriate applying method such as a spinner and a coater, and then baked to form the underlayer film.

A baking condition is appropriately selected from a baking temperature of 80° C. to 300° C. or 80° C. to 250° C. and a baking time of 0.3 to 60 minutes. It is preferable that the baking temperature be 150° C. to 250° C. and the baking time be 0.5 to 2 minutes. The thickness of the formed underlayer film is, for example, 10 to 1,000 nm, and preferably 20 to 500 nm, 10 to 300 nm, or 5 to 100 nm.

For example, a layer of a self-assembled film is then formed on the underlayer film. The layer of the self-assembled film is formed by applying a solution of composition for forming a self-assemble film on the underlayer film followed by baking. A baking temperature is appropriately selected from 80° C. to 140° C. and a baking time is appropriately selected from 0.3 to 60 minutes. It is preferable that the baking temperature be 80° C. to 120° C. and the baking time be about 0.5 to about 2 minutes.

The thickness of the self-assembled film is, for example, 30 to 10,000 nm, 20 to 2,000 nm, or about 10 to about 200 nm.

Herein, as the self-assembled film used in the present invention, a block polymer containing an organic polymer chain (A) having an organic monomer (a) as a unit structure and a polymer chain (B) that forms a bond with the organic polymer chain (A) and contains a monomer (b) different from the organic monomer (a) as a unit structure can be used.

The solid content of the composition for forming a self-assembled film may be 0.1 to 70% by mass, 0.1 to 50% by mass, or 0.1 to 30% by mass. The solid content is a ratio of the composition for forming a self-assembled film except for a solvent.

The ratio of the block copolymer in the solid content may be 30 to 100% by mass, 50 to 100% by mass, 50 to 90% by mass, or 50 to 80% by mass.

The block copolymer may have two or three or more kinds of blocks. The number of blocks in the block copolymer may be two or three or more.

For example, an adjacent polymer chain (C) containing a monomer (c) as a unit structure can be used instead of the polymer chain (B).

As the block polymer, patterns of AB, ABAB, ABA, and ABC can be obtained.

The block copolymer is obtained by a living radical polymerization or a living cationic polymerization in which a polymerization process includes only an initiation reaction and a propagation reaction and does not include a side reaction of deactivating a propagation terminal as one synthesis method. The propagation terminal can maintain a reaction of activating propagation in a polymerization reaction. A polymer (A) in which the length is the same is obtained by preventing generation of chain transfer. When a different monomer (b) is added using the propagation terminal of this polymer (A), polymerization proceeds on the basis of monomer (b). Thus, a block copolymer (AB) can be formed.

For example, when the kinds of blocks are two kinds, that is A and B, the molar ratio of a polymer chain (A) to a polymer chain (B) may be 1:9 to 9:1, and preferably 3:7 to 5:5.

A homopolymer A or B is a polymerizable compound having at least one radical polymerizable reactive group (vinyl group or vinyl group-containing organic group).

It is preferable that the block copolymer used in the present invention have a weight average molecular weight Mn of 1,000 to 100,000, or 5,000 to 100,000. A block copolymer having a weight average molecular weight of less than 1,000 may have poor coating properties for an underlying substrate. A block copolymer having a weight average molecular weight of 100,000 or more may have poor solubility in the solvent.

Each of the monomers (a) and (b) forming the block copolymer is, for example, a compound selected from the acrylic acid and an alkyl ester thereof, methacrylic acid and an alkyl ester thereof, N,N-dimethylacrylamide, dimethylaminoethyl methacrylate that may be quaternized, methacrylamide, N-tert-butylacrylamide, maleic acid and a hemiester thereof, maleic anhydride, crotonic acid, itaconic acid, acrylamide, hydroxylated (meth)acrylate, diallyldimethylammonium chloride, vinyl pyrrolidone, vinyl ether, maleimide, vinyl pyridine, vinyl imidazole, a heterocyclic vinyl compound, styrenesulfonate, allyl alcohol, vinyl alcohol, acrylate and methacrylate esters of alcohol having 1 to 13 carbon atoms, fluoroacrylate, styrene, vinyl acetate, vinyl chloride, vinylidene chloride, vinyl propionate, α-methylstyrene, tert-butylstyrene, isoprene, butadiene, cyclohexadiene, ethylene, propylene, and vinyl toluene.

When for a composition for forming a thermosetting (self-assembled) film used in the present invention, a block polymer having no cross-linking reactive group or having a cross-linking reactive group is used, a polystyrene-poly(methyl methacrylate) copolymer, a polystyrene-polyisoprene copolymer, or a polystyrene-polybutadiene copolymer is preferred.

To the composition for forming a thermosetting (self-assembled) film used in the present invention, the block polymer, a solvent, and if necessary a cross-linkable compound, a cross-linking catalyst, a light absorbing compound, a surfactant, a hardness-controlling polymer, an antioxidant, a thermal polymerization inhibitor, a surface-modifying agent, and a defoamer can be added.

In the composition for forming a thermosetting (self-assembled) film used in the present invention, a block copolymer containing two homopolymer chains (A) and (B) is generally dissolved or dispersed in an organic solvent.

This organic solvent is at least one selected from the group consisting of an alcohol-based solvent, a ketone-based solvent, an amide-based solvent, an ester-based solvent, and a nonprotonic solvent.

To the composition for forming a thermosetting (self-assembled) film used in the present invention, a component such as 13-diketone, colloidal silica, colloidal alumina, an organic polymer, a surfactant, a silane-coupling agent, a radical generator, a triazene compound, and an alkali compound may be further added.

Examples of the organic solvent used for the composition for forming a thermosetting (self-assembled) film used in the present invention include aliphatic hydrocarbon-based solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon-based solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, and trimethylbenzene; monoalcohol-based solvents such as methanol, ethanol, n-propanol, isopropanol, n-butanol, isobutanol, sec-butanol, tert-butanol, n-pentanol, isopentanol, 2-methyl butanol, sec-pentanol, tert-pentanol, 3-methoxy butanol, n-hexanol, 2-methyl pentanol, sec-hexanol, 2-ethyl butanol, sec-heptanol, heptanol-3, n-octanol, 2-ethyl hexanol, sec-octanol, n-nonyl alcohol, 2,6-dimethyl heptanol-4, n-decanol, sec-undecyl alcohol, trimethyl nonylalcohol, sec-tetradecyl alcohol, sec-heptadecyl alcohol, phenol, cyclohexanol, methyl cyclohexanol, 3,3,5-trimethyl cyclohexanol, benzyl alcohol, phenyl methyl carbinol, diacetone alcohol, and cresol; polyhydric alcohol-based solvents such as ethylene glycol, propylene glycol, 1,3-butylene glycol, pentanediol-2,4, 2-methyl pentanediol-2,4, hexanediol-2,5, heptanediol-2,4, 2-ethyl hexanediol-1,3, diethylene glycol, dipropylene glycol, triethylene glycol, tripropylene glycol, and glycerol; ketone-based solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethyl nonanone, cyclohexanone, methyl cyclohexanone, 2,4-pentanedione, acetonylacetone, diacetone alcohol, acetophenone, and fenchone; ether-based solvents such as ethyl ether, isopropyl ether, n-butyl ether, n-hexyl ester, 2-ethylhexyl ether, ethylene oxide, 1,2-propylene oxide, dioxolane, 4-methyl dioxolane, dioxane, dimethyl dioxolane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxyt triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyl tetrahydrofuran; ester-based solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; and nitrogen-containing solvents such as N-methylformamide, N,N-dimethyl formamide, N,N-diethyl formamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone.

In particular, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred in terms of storage stability of solution of the composition.

When the composition for forming a thermosetting (self-assembled) film is thermoset, a catalyst may be used. As the catalyst used in this case, the acid or acid generator that is used to cure the underlayer film can be used.

In order to further enhance adhesion property, wettability, flexibility, and planarization property to the underlying substrate, a polymer obtained by radical polymerization of polymerizable compound containing no block copolymer described below can be mixed in the composition for forming a thermosetting (self-assembled) film containing the block copolymer. The polymer can be mixed at a mixing ratio of 10 to 1,000 parts by mass, and preferably 10 to 100 parts by mass, relative to 100 parts by mass of the block copolymer.

As the polymer containing no block polymer, a cross-linking polymer can be used. Examples thereof include polymers such as hydroxystyrene, tris(2-hydroxyethyl)-isocyanuric acid, and tris(2-hydroxyethyl)-isocyanurate ester (meth)acrylate.

Specific examples of polymerizable compound other than the above-described compounds as the polymer containing no block polymer include ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tropropylene glycol di(meth)acrylate, tetrapropylene glycol di(meth)acrylate, nonapropylene glycol di(meth)acrylate, polypropylene glycol di(meth)acrylate, 2,2-bis[4-(acryloxydiethoxy)phenyl]propane, 2,2-bis[4-(methacryloxydiethoxy)phenyl]propane, 3-phenoxy-2-propanoyl acrylate, 1,6-bis(3-acryloxy-2-hydroxypropyl)-hexyl ether, pentaerythritol tri(meth)acrylate, trimethylolpropane tri(meth)acrylate, glycerol tri(meth)acrylate, pentaerythritol tetra(meth)acrylate, dipentaerythritol penta(meth)acrylate, and dipentaerythritol hexa(meth)acrylate. For example, ethylene glycol di(meth)acrylate means ethylene glycol diacrylate and ethylene glycol dimethacrylate.

Examples of a polymerizable compound having an ethylenically unsaturated bond include an urethane compound that can be obtained by a reaction of a polyvalent isocyanate compound with a hydroxyalkyl unsaturated carboxylate ester compound, a compound that can be obtained by a reaction of a polyvalent epoxy compound with a hydroxyalkyl unsaturated carboxylate ester compound, a diallyl ester compound such as diallyl phthalate, and a divinyl compound such as divinyl phthalate.

Examples of a polymerizable compound containing no block polymer and having a vinyl ether structure include vinyl-2-chloroethyl ether, vinyl n-butyl ether, 1,4-cyclohexanedimethanol divinyl ether, vinyl glycidyl ether, bis(4-(vinyloxymethyl)cyclohexylmethyl) glutarate, tri(ethylene glycol) divinyl ether, divinyl adipate ester, diethylene glycol divinyl ether, tris(4-vinyloxy)butyl trimellilate, bis(4-(vinyloxy)butyl) terephthalate, bis(4-(vinyloxy)butyl isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylol ethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexane dimethanol divinyl ether.

In the self-assembled film used in the present invention, a cross-linker may be used as an optional component. Examples of the cross-linker include a nitrogen-containing compound having a nitrogen atom substituted by a hydroxymethyl group or an alkoxymethyl group. The cross-linker is a nitrogen-containing compound having a nitrogen atom substituted by a group such as a hydroxymethyl group, a methoxymethyl group, an ethoxymethyl group, a butoxymethyl group, and a hexyloxymethyl group. The cross-linker may be cross-linked with a block copolymer or a cross-linking polymer. When the block copolymer does not have a cross-linking group, the cross-linker can be self-cross-linked to form a matrix. Thus, the block copolymer can be fixed.

The cross-linker may be used in an amount of 1 to 50 parts by mass, 3 to 50 parts by mass, 5 to 50 parts by mass, 10 to 40 parts by mass, or 20 to 30 parts by mass, relative to 100 parts by mass of the block copolymer. The elastic modulus and step coverage can be controlled by changing the kind and content of the cross-linker.

The thermosetting (self-assembled) film may further contain a cross-linking catalyst that generates cations or radicals by thermal baking (heating) to cause a thermal polymerization reaction of the thermosetting (self-assembled) film. Use of the cross-linking catalyst promotes a reaction of the cross-linker.

As the cross-linking catalyst, an acid compound such as p-toluenesulfonic acid, trifluoromethanesulfonic acid, pyridinium p-toluenesulfonic acid, salicylic acid, camphorsulfonic acid, sulfosalicylic acid, citric acid, benzoic acid, and hydroxybenzoic acid can be used.

As the cross-linking catalyst, an aromatic sulfonic acid compound can be used. Specific examples of the aromatic sulfonic acid include p-toluenesulfonic acid, pyridinium p-toluenesulfonic acid, sulfosalicylic acid, 4-chlorobenzenesulfonic acid, 4-hydroxybenzenesulfonic acid, benzenedisulfonic acid, 1-naphthalenesulfonic acid, and pyridinium-1-naphthalenesulfonic acid. One cross-linking catalyst may be used alone or two or more thereof may be used in combination.

The cross-linking catalyst may be used in an amount of 0.01 to 10 parts by mass, 0.05 to 5 parts by mass, 0.1 to 3 parts by mass, 0.3 to 2 parts by mass, or 0.5 to 1 parts by mass, relative to 100 parts by mass of the block copolymer.

The present invention includes steps of applying a general composition for forming a thermosetting (self-assembled) film to a processed substrate to form an applied film, and irradiating the applied film with light or thermally baking the applied film to form a (self-assembled) film. A liquid crystal display, a recording material for a hard disk, a solid-state imaging element, a solar cell panel, a light-emitting diode, an organic light-emitting device, a luminescent film, a fluorescent film, MEMS, an actuator, an anti-reflective material, a resist, a resist underlayer film, a resist upper layer film, or a template (mold) for nanoimprint is produced.

In the present invention, the underlayer film of the present invention in which pattern information is memorized by electron beam or laser irradiation can be applied before formation of the thermosetting (self-assembled) film. The present invention includes a case where a resist is applied, followed by lithography before formation of the thermosetting (self-assembled) film, and a case where lithography is carried out without application of a resist before formation of the thermosetting (self-assembled) film. Since the block copolymer itself used in the present invention has a function of forming a pattern by self-assembly, using the function does not necessarily require a resist.

Hereinafter, one example of use of the present invention will be described.

The underlayer film (BrushLayer, Migaku Layer) of the present invention in which pattern information is memorized due to changes in roughness and surface energy by electron beam or laser irradiation can be applied to a processed substrate used in production of a semiconductor, a liquid crystal display, a recording material for a hard disk, a solid-state imaging element, a solar cell panel, a light-emitting diode, an organic light-emitting device, a luminescent film, a fluorescent film, MEMS, an actuator, an anti-reflective material, a resist, a resist underlayer film, a resist upper layer film, or a template (mold) for nanoimprint (e.g., a silicon-silicon dioxide-coated substrate, a silicon wafer substrate, a silicon nitride substrate, a glass substrate, an ITO substrate, a polyimide substrate, and a low-dielectric constant material (low-k material)-coated substrate). The composition for forming a thermosetting (self-assembled) film is applied on the underlayer film by an appropriate applying method such as a spinner, a coater, a spray, and an ink-jet to form an applied film.

When a change in surface energy is used, it is preferable that the water contact angle of the polymer in the underlayer film be between the water contact angles of the organic polymer chain (A) and the polymer chain (B) in the block polymer.

In the present invention, the composition for forming an underlayer film of the present invention is applied to the substrate and baked to form the underlayer film, the thermosetting (self-assembled) film is formed on the underlayer film, and a pattern is formed by the self-assembled film. The thermosetting (self-assembled) film may be applied in accordance with a pattern guide that has been designed to form a self-assembled pattern. The pattern guide may be formed by applying of a resist, exposure, and development.

The self-assembled film in accordance with the pattern guide has a part to be preferentially removed by a developer or etching gas depending on the kind of unit structure in the polymer chain constituting the self-assembled film. The unit structure in the part can be developed and removed, to shrink a resist pattern width and form a sidewall.

A photoresist to be applied and formed is not particularly limited as long as it can be sensitive to exposure light, and a positive or negative photoresist can be used. Next, exposure through a predetermined mask is carried out. Subsequently, development by an alkali developer is carried out.

Before the composition for forming a (self-assembled) film using the block polymer is applied to the processed substrate, the underlayer film of the composition for forming an underlayer film of the present invention is applied to the processed substrate so that the block polymer is patterned into a vertical lamellar structure or a horizontal cylinder structure.

Since the underlayer film of the composition for forming an underlayer film of the present invention contains an aromatic vinyl compound at a specific ratio, the block polymer can be self-assembled. Furthermore, changing the surface property of the underlayer film allows memorizing the pattern information.

In order to align a pattern at a target position on the underlayer film of the present invention on the processed substrate, the underlayer film is irradiated with exogenous stimulus such as heat, ultraviolet light, laser, and radiation at a position corresponding to the alignment position and the irregularities and (hydrophilic or hydrophobic) surface energy are changed. Thus, the polymer chain (A) component and the polymer chain (B) component of the composition for forming a (self-assembled) film using the block polymer of the present invention can be each aligned at a target position.

For the polymer in the underlayer film used in the present invention, for example, the aromatic ring-containing compound or the aromatic vinyl compound can be used. In this case, the aromatic ring bonded to a main chain (e.g., naphthalene ring and benzene ring) more sensitively receives exogenous stimulus, to change the shape. Thus, the information is considered to be memorized.

Subsequently, the self-assembled film in which the alkali dissolution rate, solvent dissolution rate, and gas etching rate are changed depending on the kinds of unit structures in the polymer chains of the self-assembled film is aligned at the target position. A resist film is formed from a resist, irradiated with ultraviolet light or radiation at a position corresponding to the alignment position, and developed. As a result, the self-assembled film in which the alkali dissolution rate, and solvent dissolution rate are changed and the resist are simultaneously dissolved, resulting in development of high contrast. Thus, an excellent resist pattern can be formed.

The present invention may further include a step of forming an underlying film prior to the step of applying the composition for forming an underlayer film of a self-assembled film, followed by baking, to form the underlayer film. As the underlying film, an anti-reflective coating, a hard mask, or the like can be used.

EXAMPLES

Hereinafter, the present invention will be more specifically described with reference to Examples, but the present invention is not limited to the Examples.

SYNTHESIS EXAMPLE 1

Toluene was added to 13.0 g of carbazole, 10.3 g of dicyclopentadiene, and 0.12 g of trifluoromethanesulfonic acid, and the mixture was heated and refluxed for 21 hours. The mixture was cooled to room temperature, and diluted with 30 g of chloroform. The mixture was filtered to remove an insoluble substance, and methanol was added for reprecipitation. The resulting precipitate was collected by filtration and dried at 60° C. for 20 hours by a reduced-pressure dryer to obtain a polymer. The polymer corresponded to Formula (1-13). The weight average molecular weight Mw measured by GPC in terms of polystyrene of the polymer was 2,000.

SYNTHESIS EXAMPLE 2

46.4 g of butyl cellosolve was added to 15.0 g of phenothiazine, 9.95 g of dicyclopentadiene, and 1.13 g of trifluoromethanesulfonic acid, and the mixture was heated and stirred at 125° C. for 3 hours. The mixture was cooled to room temperature, and diluted with 30 g of tetrahydrofuran. Methanol was added for reprecipitation. The resulting precipitate was collected by filtration and dried at 85° C. for 20 hours by a reduced-pressure dryer to obtain a polymer. The polymer corresponded to Formula (1-17). The weight average molecular weight Mw measured by GPC in terms of polystyrene of the polymer was 2,500.

SYNTHESIS EXAMPLE 3

37.7 g of butyl cellosolve was added to 15.3 g of carbazole, 8.44 g of 2,5-norbornadiene, and 1.37 g of trifluoromethanesulfonic acid, and the mixture was heated and stirred at 125° C. for 3 hours. The mixture was cooled to room temperature, and diluted with 34 g of tetrahydrofuran. Methanol was added for reprecipitation. The resulting precipitate was collected by filtration and dried at 85° C. for 20 hours by a reduced-pressure dryer to obtain a polymer. The polymer corresponded to Formula (1-18). The weight average molecular weight Mw measured by GPC in terms of polystyrene of the polymer was 2,300.

SYNTHESIS EXAMPLE 4

24.84 g of butyl cellosolve was added to 10.0 g of phenol, 14.05 g of dicyclopentadiene, and 0.80 g of trifluoromethanesulfonic acid, and the mixture was heated and stirred at 135° C. for 17 hours. The mixture was cooled to room temperature, and diluted with 12 g of tetrahydrofuran. Methanol was added for reprecipitation. The resulting precipitate was collected by filtration and dried at 60° C. for 18 hours by a reduced-pressure dryer to obtain a polymer. The polymer corresponded to Formula (1-11). The weight average molecular weight Mw measured by GPC in terms of polystyrene of the polymer was 1,400.

SYNTHESIS EXAMPLE 5

36.41 g of propylene glycol monomethyl ether was added to 5.50 g of dicyclopentadiene type epoxy resin (trade name: EPICLON HP-7200H, available from DIC Corporation), 3.42 g of 1-naphthoic acid, and 0.18 g of ethyltriphenylphosphonium bromide, and the mixture was heated and refluxed under a nitrogen atmosphere for 16 hours to obtain a polymer. The polymer corresponded to Formula (3-3). The weight average molecular weight Mw measured by GPC in terms of polystyrene of the polymer was 1,600.

SYNTHESIS EXAMPLE 6

36.89 g of propylene glycol monomethyl ether was added to 5.50 g of dicyclopentadiene type epoxy resin (trade name: EPICLON HP-7200H, available from DIC Corporation), 3.54 g of 4-tert-butylbenzoic acid, and 0.18 g of ethyltriphenylphosphonium bromide, and the mixture was heated and refluxed under a nitrogen atmosphere for 15 hours to obtain a polymer. The polymer corresponded to Formula (3-1). The weight average molecular weight Mw measured by GPC in terms of polystyrene of the polymer was 2,000.

SYNTHESIS EXAMPLE 7

34.98 g of propylene glycol monomethyl ether was added to 5.00 g of dicyclopentadiene type epoxy resin (trade name: EPICLON HP-7200H, available from DIC Corporation), 3.58 g of 4-phenylbenzoic acid, and 0.17 g of ethyltriphenylphosphonium bromide, and the mixture was heated and refluxed under a nitrogen atmosphere for 16 hours to obtain a polymer. The polymer corresponded to Formula (3-2). The weight average molecular weight Mw measured by GPC in terms of polystyrene of the polymer was 1,800.

SYNTHESIS EXAMPLE 8

34.50 g of propylene glycol monomethyl ether was added to 5.50 g of dicyclopentadiene type epoxy resin (trade name: EPICLON HP-7200H, available from DIC Corporation), 2.93 g of trans-cinnamic acid, 0.18 g of ethyltriphenylphosphonium bromide, and 0.01 g of hydroquinone, and the mixture was heated and refluxed under a nitrogen atmosphere for 16 hours to obtain a polymer. The polymer corresponded to Formula (3-9). The weight average molecular weight Mw measured by GPC in terms of polystyrene of the polymer was 1,700.

SYNTHESIS EXAMPLE 9

34.15 g of propylene glycol monomethyl ether was added to 5.50 g of dicyclopentadiene type epoxy resin (trade name: EPICLON HP-7200H, available from DIC Corporation), 2.85 g of n-octanoic acid, and 0.18 g of ethyltriphenylphosphonium bromide, and the mixture was heated and refluxed under a nitrogen atmosphere for 13 hours to obtain a polymer. The polymer corresponded to Formula (3-7). The weight average molecular weight Mw measured by GPC in terms of polystyrene of the polymer was 2,100.

SYNTHESIS EXAMPLE 10

35.91 g of propylene glycol monomethyl ether was added to 6.00 g of dicyclopentadiene type epoxy resin (trade name: EPICLON HP-7200H, available from DIC Corporation), 2.78 g of cyclohexanecarboxylic acid, and 0.20 g of ethyltriphenylphosphonium bromide, and the mixture was heated and refluxed under a nitrogen atmosphere for 12 hours to obtain a polymer. The polymer corresponded to Formula (3-8). The weight average molecular weight Mw measured by GPC in terms of polystyrene of the polymer was 1,700.

SYNTHESIS EXAMPLE 11

43.51 g of propylene glycol monomethyl ether was added to 7.00 g of dicyclopentadiene type epoxy resin (trade name: EPICLON HP-7200H, available from DIC Corporation), 3.64 g of 1-naphthol, and 0.23 g of ethyltriphenylphosphonium bromide, and the mixture was heated and refluxed under a nitrogen atmosphere for 16 hours to obtain a polymer. The polymer corresponded to Formula (3-11). The weight average molecular weight Mw measured by GPC in terms of polystyrene of the polymer was 1,600.

Comparative Synthesis Example 1

143.8 g of toluene was added to 30.0 g of carbazole, 28.0 g of 1-naphthaldehyde, and 3.57 g of p-toluene sulfonic acid monohydrate, and the mixture was heated and refluxed for 27 hours. The mixture was cooled to room temperature, and diluted with 90 g of tetrahydrofuran. Methanol was added for reprecipitation. The resulting precipitate was collected by filtration and dried at 85° C. for 20 hours by a reduced-pressure dryer to obtain a polymer. The polymer corresponded to Formula (4-1). The weight average molecular weight Mw measured by GPC in terms of polystyrene of the polymer was 3,800.

Formula (4-1)

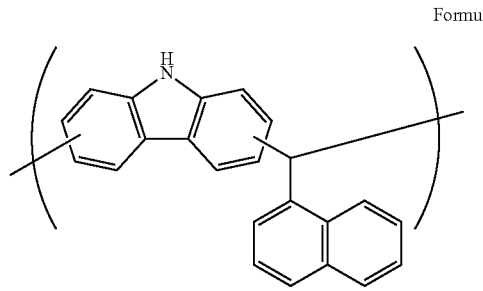

Comparative Synthesis Example 2

6.69 g of 1,4-dioxane was added to 6.7 g of carbazole, 7.28 g of 9-fluorenone, and 0.76 g of p-toluene sulfonic acid monohydrate, and the mixture was heated and stirred at 100° C. for 24 hours. The mixture was cooled to room temperature, and diluted with 34 g of chloroform. Methanol was added for reprecipitation. The resulting precipitate was collected by filtration and dried at 80° C. for 24 hours by a reduced-pressure dryer to obtain a polymer. The polymer corresponded to Formula (4-2). The weight average molecular weight Mw measured by GPC in terms of polystyrene of the polymer was 2,800.

Formula (4-2)

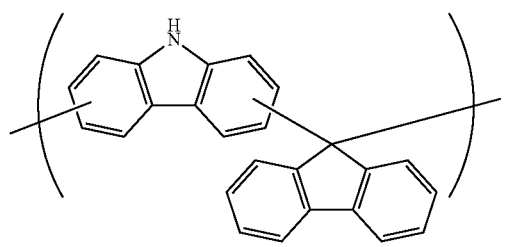

Comparative Synthesis Example 3

47.74 g of propylene glycol monomethyl ether was added to 7.00 g of epoxy cresol novolac resin (trade name: ECN1299, available from Asahi Kasei Epoxy Co., Ltd), 4.64 g of 1-naphthol, and 0.30 g of ethyltriphenylphosphonium bromide, and the mixture was heated and refluxed under a nitrogen atmosphere for 16 hours to obtain a polymer. The polymer corresponded to Formula (4-3). The weight average molecular weight Mw measured by GPC in terms of polystyrene of the polymer was 5,800.

Formula (4-3)

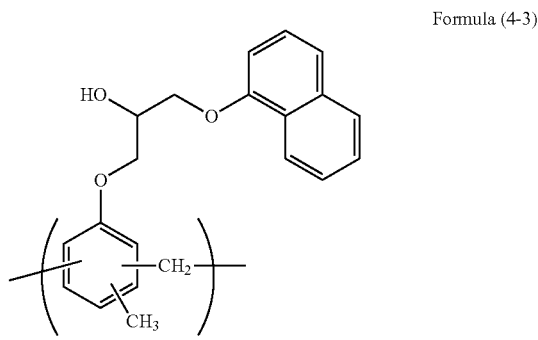

Comparative Synthesis Example 4

A mixed solution of 4.50 g of dicyclopentanyl methacrylate, 2.66 g of hydroxyethyl methacrylate, 0.21 g of 2',2-azobis(isobutyronitrile), and 14.75 g of propylene glycol monomethyl ether acetate was added dropwise to 14.75 g of propylene glycol monomethyl ether acetate stirred with heating to 85° C. under a nitrogen atmosphere over 1 hour, and the mixture was further stirred at 85° C. for 14 hours. The polymer corresponded to Formula (4-4). The weight average molecular weight Mw measured by GPC in terms of polystyrene of the polymer was 17,300.

Formula (4-4)

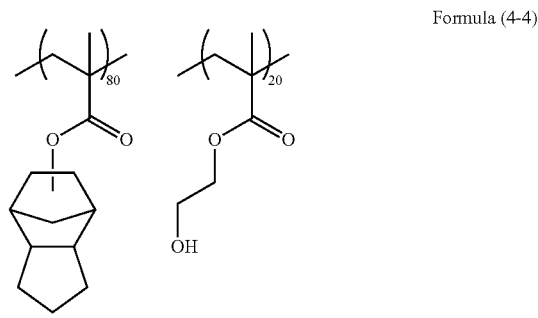

Example 1

1.0 g of the resin obtained in Synthesis Example 1 was dissolved in 0.25 g of tetramethoxymethyl glycoluril, 0.025 g of pyridinium-p-toluene sulfonate, 15.6 g of propylene glycol monomethyl ether, 6.2 g of propylene glycol monomethyl ether acetate, and 40.6 g of cyclohexanone to prepare a solution as a solution of a composition for forming an underlayer film of a self-assembled film.

Example 2

1.0 g of the resin obtained in Synthesis Example 2 was dissolved in 0.25 g of tetramethoxymethyl glycoluril, 0.025 g of pyridinium-p-toluene sulfonate, 6.2 g of propylene glycol monomethyl ether, 12.5 g of propylene glycol monomethyl ether acetate, and 43.7 g of cyclohexanone to prepare a solution as a solution of a composition for forming an underlayer film of a self-assembled film.

Example 3

1.0 g of the resin obtained in Synthesis Example 3 was dissolved in 0.25 g of tetramethoxymethyl glycoluril, 0.025 g of pyridinium-p-toluene sulfonate, 12.5 g of propylene glycol monomethyl ether, and 50.1 g of propylene glycol monomethyl ether acetate to prepare a solution as a solution of a composition for forming an underlayer film of a self-assembled film.

Example 4

0.26 g of the resin obtained in Synthesis Example 4 was dissolved in 0.07 g of tetramethoxymethyl glycoluril, 0.007 g of pyridinium-p-toluene sulfonate, 8.90 g of propylene glycol monomethyl ether, and 20.76 g of cyclohexanone to prepare a solution as a solution of a composition for forming an underlayer film of a self-assembled film.

Example 5

0.27 g of the resin obtained in Synthesis Example 5 was dissolved in 0.05 g of tetramethoxymethyl glycoluril, 0.005 g of pyridinium-p-toluene sulfonate, 20.77 g of propylene glycol monomethyl ether, and 8.90 g of propylene glycol monomethyl ether acetate to prepare a solution as a solution of a composition for forming an underlayer film of a self-assembled film.

Example 6

0.27 g of the resin obtained in Synthesis Example 6 was dissolved in 0.05 g of tetramethoxymethyl glycoluril, 0.005 g of pyridinium-p-toluene sulfonate, 20.77 g of propylene glycol monomethyl ether, and 8.90 g of propylene glycol monomethyl ether acetate to prepare a solution as a solution of a composition for forming an underlayer film of a self-assembled film.

Example 7

0.27 g of the resin obtained in Synthesis Example 7 was dissolved in 0.05 g of tetramethoxymethyl glycoluril, 0.005 g of pyridinium-p-toluene sulfonate, 20.77 g of propylene glycol monomethyl ether, and 8.90 g of propylene glycol monomethyl ether acetate to prepare a solution as a solution of a composition for forming an underlayer film of a self-assembled film.

Example 8

0.26 g of the resin obtained in Synthesis Example 8 was dissolved in 0.07 g of tetramethoxymethyl glycoluril, 0.007 g of pyridinium-p-toluene sulfonate, 20.76 g of propylene glycol monomethyl ether, and 8.90 g of propylene glycol monomethyl ether acetate to prepare a solution as a solution of a composition for forming an underlayer film of a self-assembled film.

Example 9

0.27 g of the resin obtained in Synthesis Example 9 was dissolved in 0.05 g of tetramethoxymethyl glycoluril, 0.005 g of pyridinium-p-toluene sulfonate, 20.77 g of propylene glycol monomethyl ether, and 8.90 g of propylene glycol monomethyl ether acetate to prepare a solution as a solution of a composition for forming an underlayer film of a self-assembled film.

Example 10

0.27 g of the resin obtained in Synthesis Example 10 was dissolved in 0.05 g of tetramethoxymethyl glycoluril, 0.005 g of pyridinium-p-toluene sulfonate, 20.77 g of propylene glycol monomethyl ether, and 8.90 g of propylene glycol monomethyl ether acetate to prepare a solution as a solution of a composition for forming an underlayer film of a self-assembled film.

Example 11

0.49 g of the resin obtained in Synthesis Example 11 was dissolved in 0.10 g of tetramethoxymethyl glycoluril, 0.009 g of pyridinium-p-toluene sulfonate, 20.58 g of propylene glycol monomethyl ether, and 8.82 g of propylene glycol monomethyl ether acetate to prepare a solution as a solution of a composition for forming an underlayer film of a self-assembled film.

Example 12

0.22 g of resin of Formula (5-1) was dissolved in 0.05 g of tetramethoxymethyl glycoluril, 0.006 g of 5-sulfosalicylic acid dihydrate, 0.03 g of the resin of Formula (3-7) obtained in Synthesis Example 9 (14% by mass relative to the resin of Formula (5-1)), 26.72 g of propylene glycol monomethyl ether, and 2.97 g of propylene glycol monomethyl ether acetate to prepare a solution as a solution of a composition for forming an underlayer film of a self-assembled film.

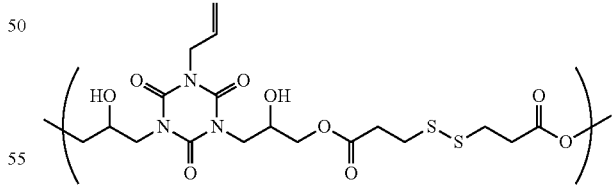

Formula (5-1)

COMPARATIVE EXAMPLE 1

1.0 g of the resin obtained in Comparative Synthesis Example 1 was dissolved in 0.15 g of tetramethoxymethyl glycoluril, 0.015 g of pyridinium-p-toluene sulfonate, 11.4 g of propylene glycol monomethyl ether, and 45.7 g of propylene glycol monomethyl ether acetate to prepare a solution as a solution of a composition for forming an underlayer film of a self-assembled film.

COMPARATIVE EXAMPLE 2

1.0 g of the resin obtained in Comparative Synthesis Example 2 was dissolved in 0.15 g of tetramethoxymethyl glycoluril, 0.015 g of pyridinium-p-toluene sulfonate, 11.4 g of propylene glycol monomethyl ether, and 45.7 g of propylene glycol monomethyl ether acetate to prepare a solution as a solution of a composition for forming an underlayer film of a self-assembled film.

COMPARATIVE EXAMPLE 3

0.49 g of the resin obtained in Comparative Synthesis Example 3 was dissolved in 0.10 g of tetramethoxymethyl glycoluril, 0.009 g of pyridinium-p-toluene sulfonate, 20.58 g of propylene glycol monomethyl ether, and 8.82 g of propylene glycol monomethyl ether acetate to prepare a solution as a solution of a composition for forming an underlayer film of a self-assembled film.

COMPARATIVE EXAMPLE 4

0.35 g of the resin obtained in Comparative Synthesis Example 4 was dissolved in 0.09 g of tetramethoxymethyl glycoluril, 0.009 g of pyridinium-p-toluene sulfonate, 5.91 g of propylene glycol monomethyl ether, and 23.64 g of propylene glycol monomethyl ether acetate to prepare a solution as a solution of a composition for forming an underlayer film of a self-assembled film.

COMPARATIVE EXAMPLE 5

0.25 g of the resin of Formula (5-1) was dissolved in 0.06 g of tetramethoxymethyl glycoluril, 0.006 g of 5-sulfosalicylic acid dihydrate, 26.72 g of propylene glycol monomethyl ether, and 2.97 g of propylene glycol monomethyl ether acetate to prepare a solution as a solution of a composition for forming an underlayer film of a self-assembled film.

(Elution Test in Photoresist Solvent)

Each of the solutions of the compositions for forming an underlayer film of a self-assembled film prepared in Examples 1 to 16 and Comparative Examples 1 to 5 was applied on a substrate (silicon wafer) using a spin coater. The substrate was baked on a hot plate at 240° C. for 1 minute to form an underlayer film layer (thickness: 30 nm). The underlayer film was subjected to an immersion test in a solvent used for a resist, for example, a mixed solvent of propylene glycol monomethyl ether (PGME) and propylene glycol monomethyl ether acetate (PGMEA) (70% by mass and 30% by mass). The results thereof are shown in Table 1. The underlayer film was immersed in each solvent for 60 seconds. The film thicknesses before and after the immersion were measured, and a remaining film ratio was calculated from (film thickness after the immersion)/(film thickness before the immersion)×100.

TABLE 1

| Remaining film ratio (%) after elution test | |
|---|---|
| Composition for forming underlayer film | Remaining film ratio |
| Example 1 | 100% |
| Example 2 | 100% |
| Example 3 | 100% |
| Example 4 | 100% |

TABLE 1-continued

| Remaining film ratio (%) after elution test | |
|---|---|
| Composition for forming underlayer film | Remaining film ratio |
| Example 5 | 99% |
| Example 6 | 100% |
| Example 7 | 100% |
| Example 8 | 100% |
| Example 9 | 100% |
| Example 10 | 100% |
| Example 11 | 99% |
| Example 12 | 100% |
| Comparative Example 1 | 100% |
| Comparative Example 2 | 100% |
| Comparative Example 3 | 98% |
| Comparative Example 4 | 100% |
| Comparative Example 5 | 100% |

As confirmed from the results in Table 1, the underlayer films of a self-assembled film obtained in Examples 1 to 12 and Comparative Examples 1 to 5 are not eluted in a photoresist solvent after film formation on the substrate.

(Preparation of Block Copolymer)

3.42 g of polystyrene-poly(methyl methacrylate) copolymer (trade name: PS(18000)-b-PMMA(18000) available from POLYMER SOURCE INC., polydispersity: 1.07) as a block copolymer was dissolved in 216.57 g of propylene glycol monomethyl ether acetate, and the mixture was filtered through a microfilter made of polyethylene with a pore diameter of 0.1 μm. Thus, a solution of composition for forming a self-assembled film containing the block copolymer was prepared.

(Evaluation of Self-Assembly of Block Copolymer)

Each of the compositions for forming an underlayer film of a self-assembled film obtained in Examples 1 to 12 and Comparative Examples 1 to 4 was applied to a silicon wafer using a spinner, and heated at 240° C. for 1 minute on a hot plate to obtain an underlayer film (A layer) to be present in a lower layer of a self-assembled film. The thickness of the underlayer film was 30 nm.

The composition for forming a self-assembled film containing the block copolymer was applied on the underlayer film using a spinner, and heated at 100° C. for 1 minute on a hot plate to form a self-assembled film (B layer) with a thickness of 40 nm. Subsequently, the silicon wafer was heated at 240° C. for 5 minutes on a hot plate under a nitrogen atmosphere to induce a microphase separated structure of the block copolymer.

(Observation of Microphase Separated Structure)

The shape of the silicon wafer having the induced microphase separated structure was observed from above by a scanning electron microscope (Hitachi S-9380). The results are shown in Table 2.

Figure 2:
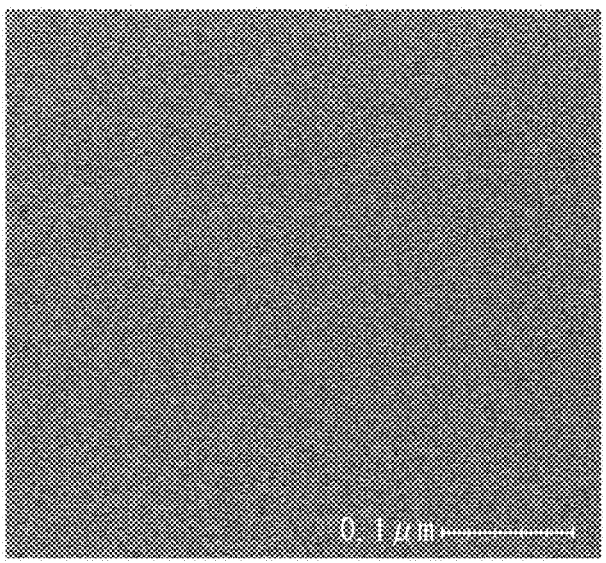
FIG. 2 is an electron micrograph of a self-assembled film of block copolymer that is formed on an underlayer film formed from a composition for forming an underlayer film of a self-assembled film obtained in Comparative Example 1 and that forms a horizontal lamella structure (magnification: 200,000 times).

FIG. 1 shows an electron micrograph (magnification: 200,000 times) of the self-assembled film containing the block copolymer that was formed in a vertical lamella structure on the underlayer film formed from the composition for forming an underlayer film obtained in Example 1. FIG. 2 shows an electron micrograph (magnification: 200,000 times) of the self-assembled film containing the block copolymer that was formed in a horizontal lamella structure on the underlayer film formed from the composition for forming an underlayer film obtained in Comparative Example 1.

TABLE 2

Observation of Shape of Block Copolymer (Self-Assembled Film) on Underlayer Film

| Composition for forming underlayer film (A Layer) | Shape of Self-Assembled Film (B Layer) |
|---|---|
| Example 1 | vertical lamella |
| Example 2 | vertical lamella |
| Example 3 | vertical lamella |
| Example 4 | vertical lamella |
| Example 5 | vertical lamella |
| Example 6 | vertical lamella |
| Example 7 | vertical lamella |
| Example 8 | vertical lamella |
| Example 9 | vertical lamella |
| Example 10 | vertical lamella |
| Example 11 | vertical lamella |
| Example 12 | vertical lamella |
| Comparative Example 1 | horizontal lamella |
| Comparative Example 2 | horizontal lamella |
| Comparative Example 3 | horizontal lamella |
| Comparative Example 4 | horizontal lamella |
| Comparative Example 5 | horizontal lamella |

From the results in Table 2, the underlayer films of a self-assembled film obtained in Examples 1 to 12 can induce a microphase separated structure of the block copolymer including polystyrene and polymethyl methacrylate vertically to the substrate (vertical lamella shape).

On the other hand, the underlayer films obtained in Comparative Examples 1 to 5 does not allow microphase separation of the block copolymer vertically to the substrate (horizontal lamella shape).

The invention claimed is:

1. A composition for forming an underlayer film of a self-assembled film, where the self-assembled film is a block polymer containing an organic polymer chain (A) having an organic monomer (a) as a unit structure and a polymer chain (B) that forms a bond with the organic polymer chain (A) and contains a monomer (b) different from the organic monomer (a) as a unit structure; the composition for forming an underlayer film comprising a polymer having a unit structure containing an aliphatic polycyclic structure in a main chain; wherein
the self-assembled film is formed in a vertical lamella structure; and
the polymer contained in the underlayer film has a unit structure of Formula (1):

  Formula (1)

where
X is a divalent group having an aromatic ring-containing structure from a heterocyclic compound or a homocyclic compound, wherein
the heterocyclic compound is a phenothiazine moiety that is optionally substituted, and
the homocyclic compound comprises:
a benzene moiety that is substituted with an amino group; and
Y is a divalent group having an aliphatic polycyclic structure; wherein
the polymer contained in the underlayer film having unit structure of Formula (1) is obtained by a condensation reaction of an aromatic ring-containing compound with an aliphatic polycyclic compound, the aromatic ring-containing compound resulting in the X of unit structure of Formula (1) and the aliphatic polycyclic compound resulting in the Y of the unit structure of Formula (1).

2. The composition for forming an underlayer film according to claim 1, wherein
the aliphatic polycyclic structure is from a bi- to hexacyclic diene compound.

3. The composition for forming an underlayer film according to claim 1, wherein
the aliphatic polycyclic structure is from a dicyclopentadiene or a norbornadiene.

4. The composition for forming an underlayer film according to claim 1, further comprising a cross-linker.

5. The composition for forming an underlayer film according to claim 1, further comprising an acid or an acid generator.

6. A method for forming a pattern structure comprising steps of:
applying the composition for forming an underlayer film of a self-assembled film according to claim 1 on a substrate, followed by baking, to form an underlayer film; and applying a composition for forming a self-assembled film on the underlayer film, followed by baking, to form a self-assembled film.

7. The method for forming a pattern structure according to claim 6, comprising a step of forming an underlying film prior to the step of applying the composition for forming an underlayer film of a self-assembled film, followed by baking, to form an underlayer film.

8. The method for forming a pattern structure according to claim 7, wherein the underlying film is an anti-reflective coating or a hard mask.

9. A device having a pattern structure formed by the method for forming a pattern structure according claim 6.

10. The composition for forming an underlayer film according to claim 1, wherein X is the divalent group having an aromatic ring-containing structure from the heterocyclic compound.

11. The composition for forming an underlayer film according to claim 1, wherein X is the divalent group having an aromatic ring-containing structure from the homocyclic compound, and the benzene moiety is further substituted with at least one hydroxy group.

12. The composition for forming an underlayer film according to claim 1, wherein X is the divalent group having an aromatic ring-containing structure from the homocyclic compound.

13. A composition for forming an underlayer film of a self-assembled film, where the self-assembled film is a block polymer containing an organic polymer chain (A) having an organic monomer (a) as a unit structure and a polymer chain (B) that forms a bond with the organic polymer chain (A) and contains a monomer (b) different from the organic monomer (a) as a unit structure; the composition for forming an underlayer film comprising a polymer having a unit structure containing an aliphatic polycyclic structure in a main chain; wherein
the self-assembled film is formed in a vertical lamella structure; and
the polymer contained in the underlayer film has a unit structure of Formula (1):

  Formula (1)

where
n is an integer that has a value that is in a range such that the polymer contained in the underlayer film having the unit structure of Formula (1) has a weight average molecular weight Mw in the range of from 500 to 1,000,000, X is a divalent group having an aromatic ring-containing structure from a homocyclic compound, the homocyclic compound being a naphthalene moiety that is substituted with at least one hydroxy group; and Y is a divalent group having an aliphatic polycyclic structure, wherein the aliphatic polycyclic structure of the Y of the unit structure of Formula (1) is not from a dicyclopentadiene.

14. A composition for forming an underlayer film of a self-assembled film, where the self-assembled film is a block polymer containing an organic polymer chain (A) having an organic monomer (a) as a unit structure and a polymer chain (B) that forms a bond with the organic polymer chain (A) and contains a monomer (b) different from the organic monomer (a) as a unit structure; the composition for forming an underlayer film comprising a polymer having a unit structure containing an aliphatic polycyclic structure in a main chain; wherein the self-assembled film is formed in a vertical lamella structure; and the polymer contained in the underlayer film has a unit structure of Formula (1):

 Formula (1)

where

X is a divalent group having an aromatic ring-containing structure from a heterocyclic compound or a homocyclic compound, wherein the heterocyclic compound is a phenothiazine moiety that is optionally substituted, and the homocyclic compound comprises:

a benzene moiety that is substituted with an amino group, or a naphthalene moiety that is substituted with at least one hydroxyl group; and Y is a divalent group having an aliphatic polycyclic structure; wherein the polymer contained in the underlayer film having unit structure of Formula (1) is obtained by a condensation reaction of an aromatic ring-containing compound with an aliphatic polycyclic compound, the aromatic ring-containing compound resulting in the X of unit structure of Formula (1) and the aliphatic polycyclic compound resulting in the Y of the unit structure of Formula (1), and the aliphatic polycyclic structure of the Y of the unit structure of Formula (1) is not from a dicyclopentadiene.

* * * * *